United States Patent [10] Patent No.: US 10,651,862 B1
Barnette et al. (45) Date of Patent: May 12, 2020

(54) LOCKING A PLL TO THE NEAREST EDGE OF THE INPUT CLOCK WHEN THE INPUT CLOCK IS DIVIDED DOWN BEFORE USE IN THE PLL

(71) Applicant: Silicon Laboratories Inc., Austin, TX (US)

(72) Inventors: James D. Barnette, Austin, TX (US); Krishnan Balakrishnan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/441,898

(22) Filed: Jun. 14, 2019

(51) Int. Cl.
*H03L 7/06* (2006.01)
*H03L 7/099* (2006.01)
*H03L 7/18* (2006.01)
*H03K 3/03* (2006.01)
*H03L 7/07* (2006.01)
*H03L 7/091* (2006.01)
*H04L 7/033* (2006.01)

(52) U.S. Cl.
CPC ......... *H03L 7/0991* (2013.01); *H03K 3/0315* (2013.01); *H03L 7/07* (2013.01); *H03L 7/091* (2013.01); *H03L 7/18* (2013.01); *H04L 7/0337* (2013.01)

(58) Field of Classification Search
CPC ......... H03L 7/0891; H03L 7/18; H03L 7/093; H03L 7/087; H03L 7/10
USPC .................................................. 327/156, 99
See application file for complete search history.

(56) References Cited

U.S. PATENT DOCUMENTS

2008/0246521 A1\* 10/2008 Feng .................... H03L 7/1974
327/159
2010/0123491 A1\* 5/2010 Palmer ..................... H03L 7/07
327/156
2014/0320181 A1\* 10/2014 Mitric ....................... H03L 7/10
327/156

\* cited by examiner

*Primary Examiner* — Anh Q Tra
(74) *Attorney, Agent, or Firm* — Zagorin Cave LLP

(57) ABSTRACT

A phase-locked loop (PLL) has a first divider that receives a first reference clock signal and supplies a first divided reference clock signal. A second divider receives a second reference clock signal and supplies a second divided reference clock signal. On switching between use of reference clock signals, when the phase difference between the first divided signal and the second divided signal includes one or more clock periods of the second reference clock signal, the PLL performs a phase adjust to remove the one or more clock periods. The phase adjust can be performed in the feedback divider or as an offset in the loop if digital edges of the clock signals are available. The phase adjust ensures the phase adjust on the PLL output caused by switching reference clocks is the phase difference between the reference clock signals before division.

20 Claims, 7 Drawing Sheets

LOCKING A PLL TO THE NEAREST EDGE OF THE INPUT CLOCK WHEN THE INPUT CLOCK IS DIVIDED DOWN BEFORE USE IN THE PLL

BACKGROUND

Field of the Invention

The description herein relates to phase-locked loops (PLL) and more particularly to dividing reference signals being supplied to PLLs.

Description of the Related Art

FIG. 1 illustrates a phase-locked loop (PLL) 100 that has the ability to switch between reference clock signals INx 101 and INy 103 to generate a PLL output signal OUT 105 that is phase locked to the currently selected reference clock signal. The PLL works by continuously comparing the phases of the feedback (fb) clock signal 107 and the reference clock signal (ref) 109 in the phase and frequency detector (PFD) 111 and adjusting the phase of OUT 105 to keep OUT phase aligned to the selected reference clock signal. Output divider 115 divides the output 117 of the digitally controlled oscillator (DCO) to generate OUT 105.

FIG. 2 illustrates a timing diagram illustrating operation of PLL 100. In FIG. 2, INx is selected as the reference clock signal ref and OUT is phase aligned to INx at 201. As can be seen the feedback clock signal (fb) 107 and the reference clock signal (initially refx) are also aligned at 201. The clock signal INy has the same frequency as INx but is offset in phase from INx by $\Phi_{off}$. When the PLL switches from using INx to using INy as the reference clock signal, PLL 100 moves the phase of OUT by $\Phi_{off}$ so that OUT is aligned to INy as shown at 203. In the embodiment of FIG. 2, the divider 115 divides the DCO output signal 117 by (3×fb-divide-ratio) to generate OUT 105, where the fb-divide-ratio is the divide ratio of feedback divider 119.

SUMMARY OF EMBODIMENTS OF THE INVENTION

In order to improve PLLs in an embodiment, a method includes receiving a first reference clock signal, dividing the first reference clock signal in a first divider and supplying a divided first reference clock signal. The method further includes receiving a second reference signal, dividing the second reference clock signal in a second divider, and supplying a divided second reference clock signal. The method includes switching from using the divided first reference clock signal as basis for a reference clock signal in a phase-locked loop to using the divided second reference clock signal as the basis for the reference clock signal in the phase-locked loop. Responsive to a phase difference between the divided first reference clock signal and the divided second reference clock signal, when the phase difference includes one or more clock periods of the second reference clock signal, as part of switching to using the divided second reference clock signal as the basis for the reference clock, performing a phase adjust to remove the one or more clock periods of the second reference clock signal from the phase difference.

In another embodiment a method includes a first divider coupled to receive a first reference clock signal and supply a first divided reference clock signal. A second divider is coupled to receive a second reference clock signal and supply a second divided reference clock signal. The apparatus is responsive to a phase difference between the first divided signal and the second divided signal including one or more clock periods of the second reference clock signal, to perform a phase adjust to remove the one or more clock periods of the second reference clock signal present in the phase difference.

In another embodiment a phase-locked loop includes a first divider coupled to receive a first reference clock signal and supply a first divided reference clock signal. A second divider receives a second reference clock signal and supplies a second divided reference clock signal. A phase adjust calculation circuit determines an integral number of clock periods of the second reference clock signal that are present in a first phase difference between the first divided signal and the second divided signal. A phase and frequency detector (PFD) is coupled to determine a second phase difference between a feedback signal and a reference signal. The PLL performs a phase adjustment equal to the integral number of clock periods of the second reference clock signal in the first phase difference to thereby cause the phase and frequency detector, on switching from using of the first divided reference clock signal as the basis for the reference signal to using the second reference clock signal as the basis for the reference signal, to see as a maximum value of the second phase difference a phase difference between the first reference clock signal and the second reference clock signal with one or more periods of the second reference clock signal present in the first phase difference.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
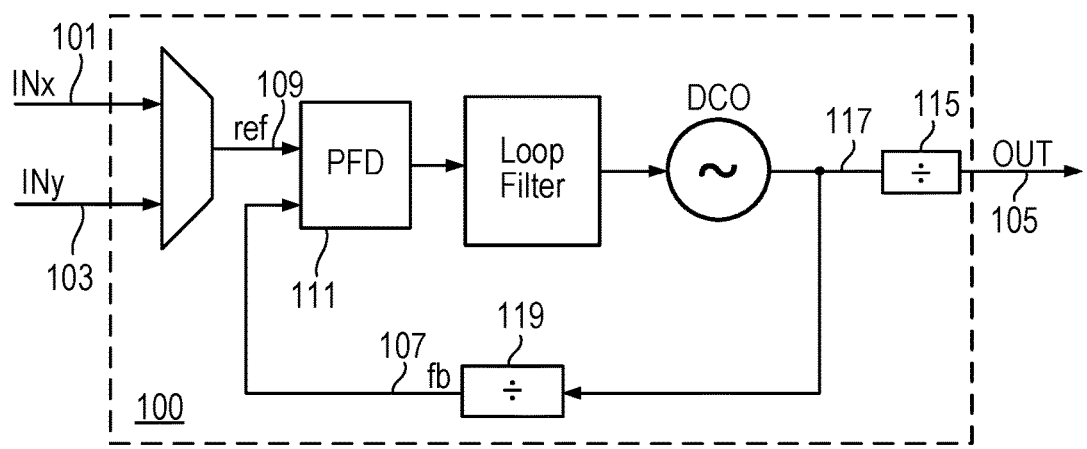
FIG. 1 illustrates a phase-locked loop that can switch between two input reference clock signals.
Figure 2:
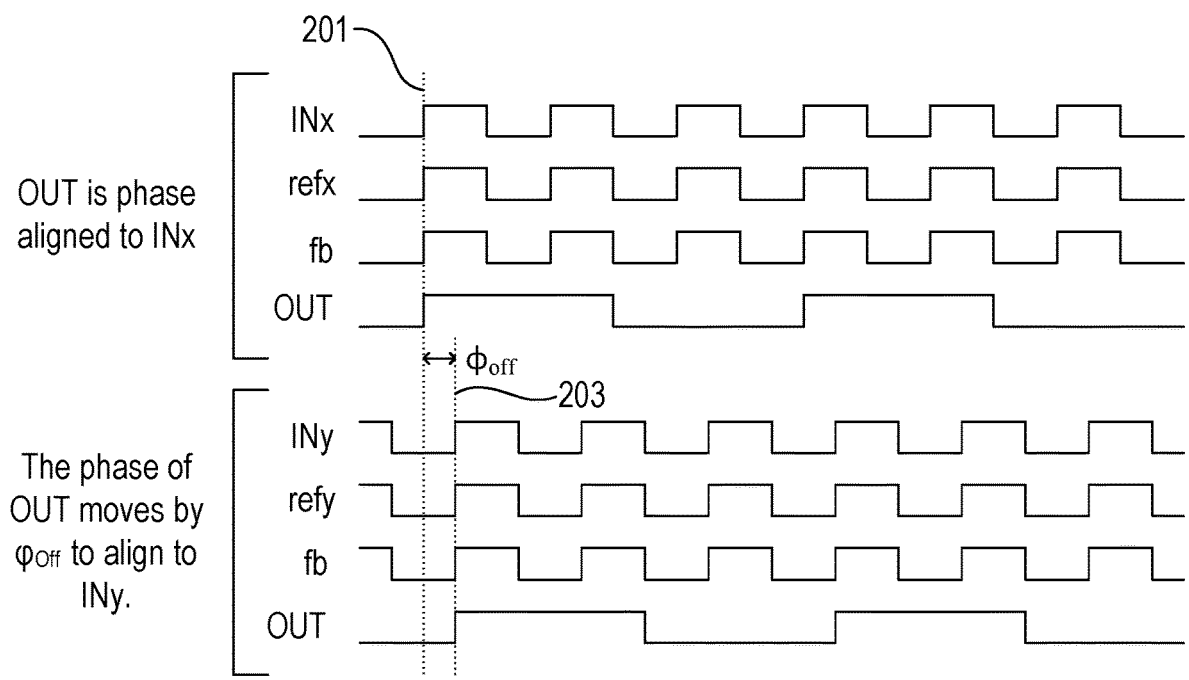
FIG. 2 shows a timing diagram illustrating switching from using a first reference clock signal to using a second reference clock signal.
Figure 3:
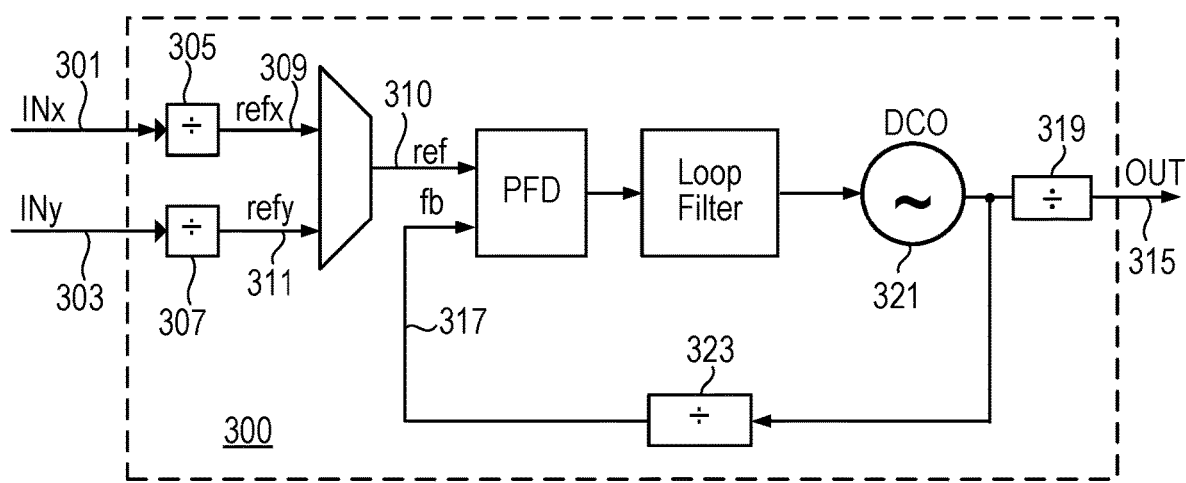
FIG. 3 illustrates a phase-locked loop that divides the input clock signals before supplying the input clock signals to the phase and frequency detector (PFD).
Figure 4:
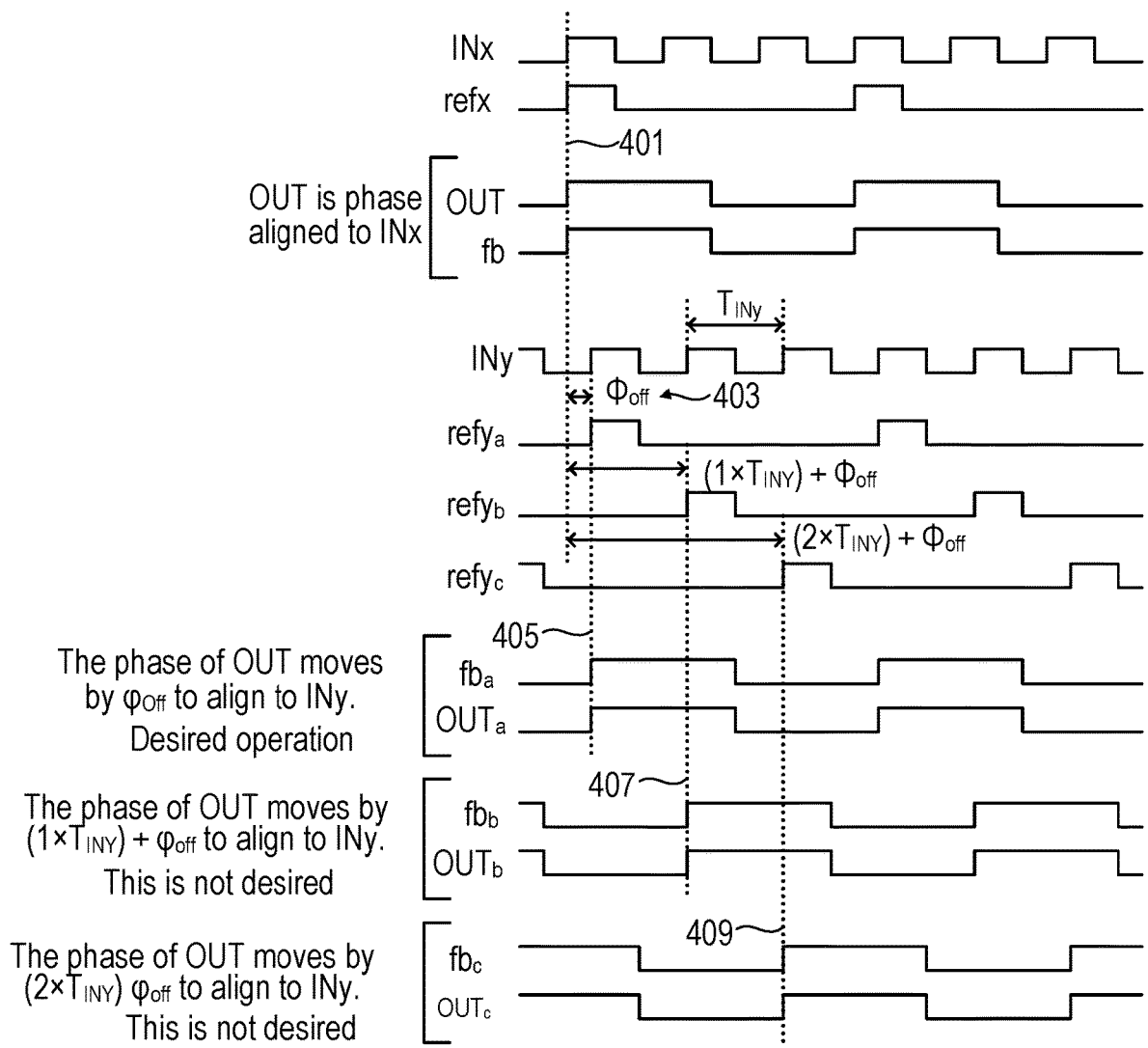
FIG. 4 illustrates a timing diagram illustrating the variable phase differences that can occur when reference clock signals are divided.

FIGS. 3 and 4 illustrate how variable phase differences can arise when using input dividers on reference clock signals. Referring to FIG. 3, PLL 300 receives INx 301 and INy 303 and divides the reference clock signals in input dividers 305 and 307 to reduce the frequency of the reference clock signals before the reference clock signals are utilized by the PLL 300. The input dividers supply the divided down reference signals refx 309 and refy 311. However, if INx and INy are divided down in their input dividers, the phase of refy 311 compared to refx 309 can be arbitrary, and depends on when the clocks INx and INy started toggling at the input to the dividers. FIG. 4 is a timing diagram illustrating the operation of the PLL 300 with input dividers.

With reference to FIGS. 3 and 4, assume in FIG. 4 that the inputs INx 301 and INy 303 are divided by 3 (i.e., the divisors of input dividers 305 and 307 are 3). Initially, PLL 300 selects refx as the reference clock ref 310. The PLL output signal OUT 315 is phase aligned to INx as illustrated by OUT 315, fb 317, INx 301, and refx 309 all being phase aligned at 401. Output divider 319 divides the output of DCO 321 to generate OUT 315. In the embodiment illustrated in FIG. 4 the output divider 319 divides the DCO output signal by (1×fb-divide-ratio) to generate OUT 315, where the fb-divide-ratio is the divide ratio of feedback divider 323.

Assume INy is offset from INx by $\Phi_{OFF}$ as shown at 403. However, because of the divider 307, the divided down signal refy can arbitrarily be offset from refx by either $\Phi$off, ($T_{INy}+\Phi$off), or ($2\times T_{INy}+\Phi$off), corresponding respectively to refya, refyb, or refyc, where $T_{INy}$ is the period of the reference clock signed INy. In such a case, switching from INx to INy can cause OUT to move its phase by $\Phi$off plus an integral multiple of INy clock periods ($T_{INy}$). In FIG. 4, that is shown as OUTa aligning with fba at 405 (desired operation), OUTb aligning with fbb at 407 (undesired operation), and OUTc aligning with fbc at 409 (undesired operation). It is desirable that when switching to using refy as the reference clock instead of refx, that the phase offset seen by the PLL be the phase offset between INy and INx.

In order to provide the desired phase offset, existing techniques require the input dividers to be bypassed to ensure that the phase movement on the outputs of a PLL correspond directly to the phase offset between the inputs that are being switched. This also restricts the frequency of inputs—especially in PLL's that employ a time-to-digital (TDC) conversion of signal edges due to the limits on the rate at which TDC's can convert signal edges into a digital value accurately. An example of a high resolution TDC can be found in U.S. Pat. No. 10,067,478, naming Raghunandan Kolar Ranganathan as inventor, entitled "Use of A Recirculating Delay Line With a Time-To-Digital Converter, issued Sep. 4, 2018, which application is incorporated herein by reference in its entirety.

Figure 5:
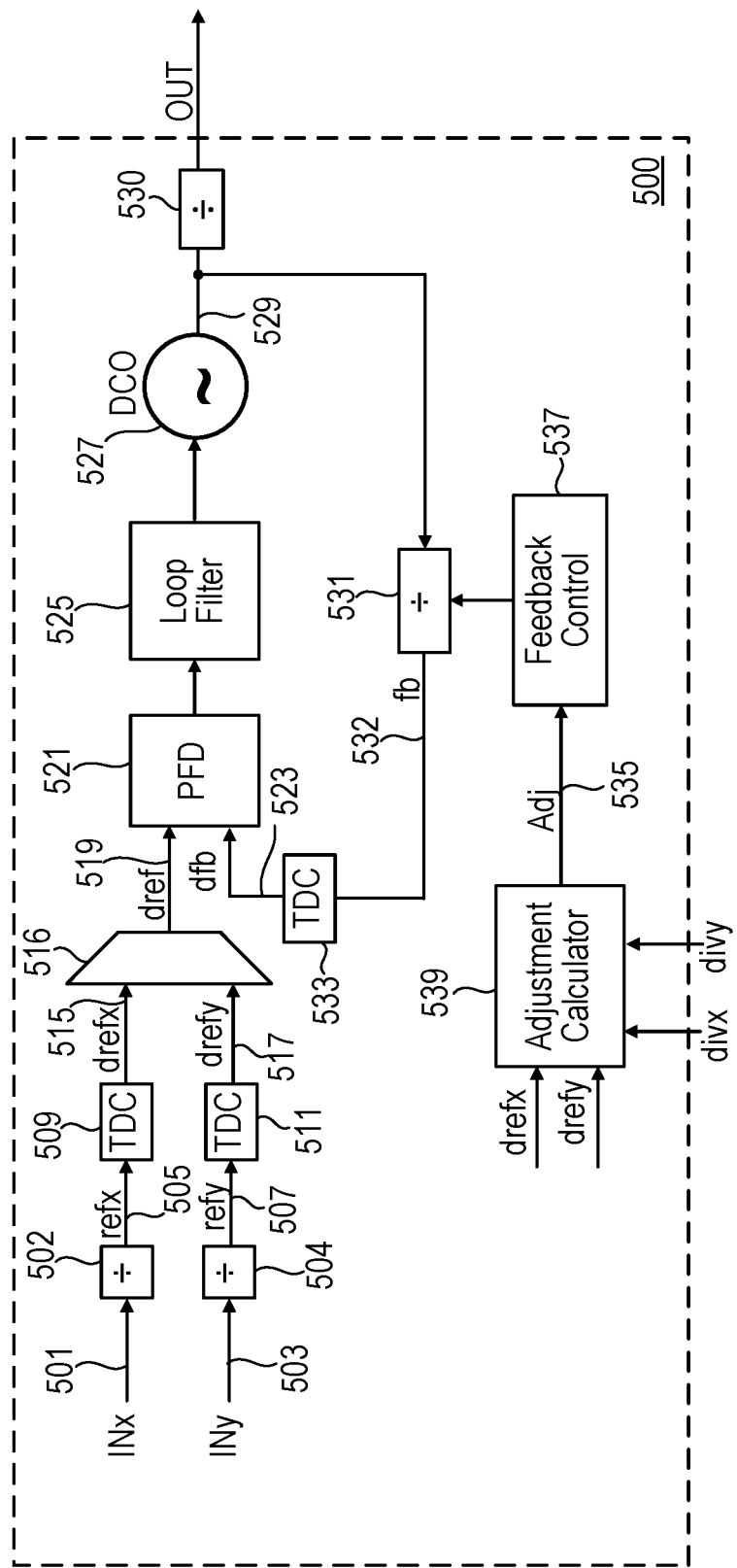
FIG. 5 illustrates an embodiment that limits the phase differences associated with reference clock input dividers by making a phase adjustment corresponding to an integral number of reference clock periods in a feedback divider.

Referring to FIG. 5, illustrated is an embodiment that aligns the PLL output to the nearest edge of the input reference signal regardless of the state of the input dividers. Digital PLL 500 uses time-to-digital converters (TDC's) to covert the time at which clock edges occur into a digital representation. Divider 502 receives INx 501 and supplies the divided signal refx 505. Divider 504 receives INy 503 and supplies the divided signal refy 507. TDC 509 receives refx 505 and converts active edges (or both edges) of refx 505 to digital values and supplies drefx 515 to selector circuit 516. TDC 511 receives refy 507 and converts active edges (or both edges) of refy 507 to digital values and supplies drefy 517 to selector circuit 516. Depending on which reference clock signal is selected, selector circuit 516 selects either drefx or drefy as the digital reference signal dref 519. While illustrated as a multiplexer, note that the selector circuit 516 may be implemented as logic to select the right digital value from memory (not shown in FIG. 5). Such logic selects the location in memory corresponding to drefx 515 or to drefy 517 as the digital reference signal dref 519. PFD 521 receives dref 519 and digital feedback signal dfb 523, determines the phase difference between the signals, and supplies the phase difference to loop filter 525, which in turn controls the digitally controlled oscillator (DCO) 527. DCO 527 generates the oscillator output signal 529, which is supplied to the output divider 530 and to the feedback divider 531. Feedback divider 531 divides the oscillator output signal 529 and generates feedback signal 532. The output divider 530 divides the oscillator output signal 520 and generates OUT 534. TDC 533 receives feedback signal 532 and generates the digital feedback signal dfb 523. As explained with reference to FIGS. 5 and 6, the PLL 500 aligns the PLL output signal OUT 529 to the newly selected divided down reference clock signal with the phase offset being the phase offset between INx 501 and INy 503.

Figure 6:
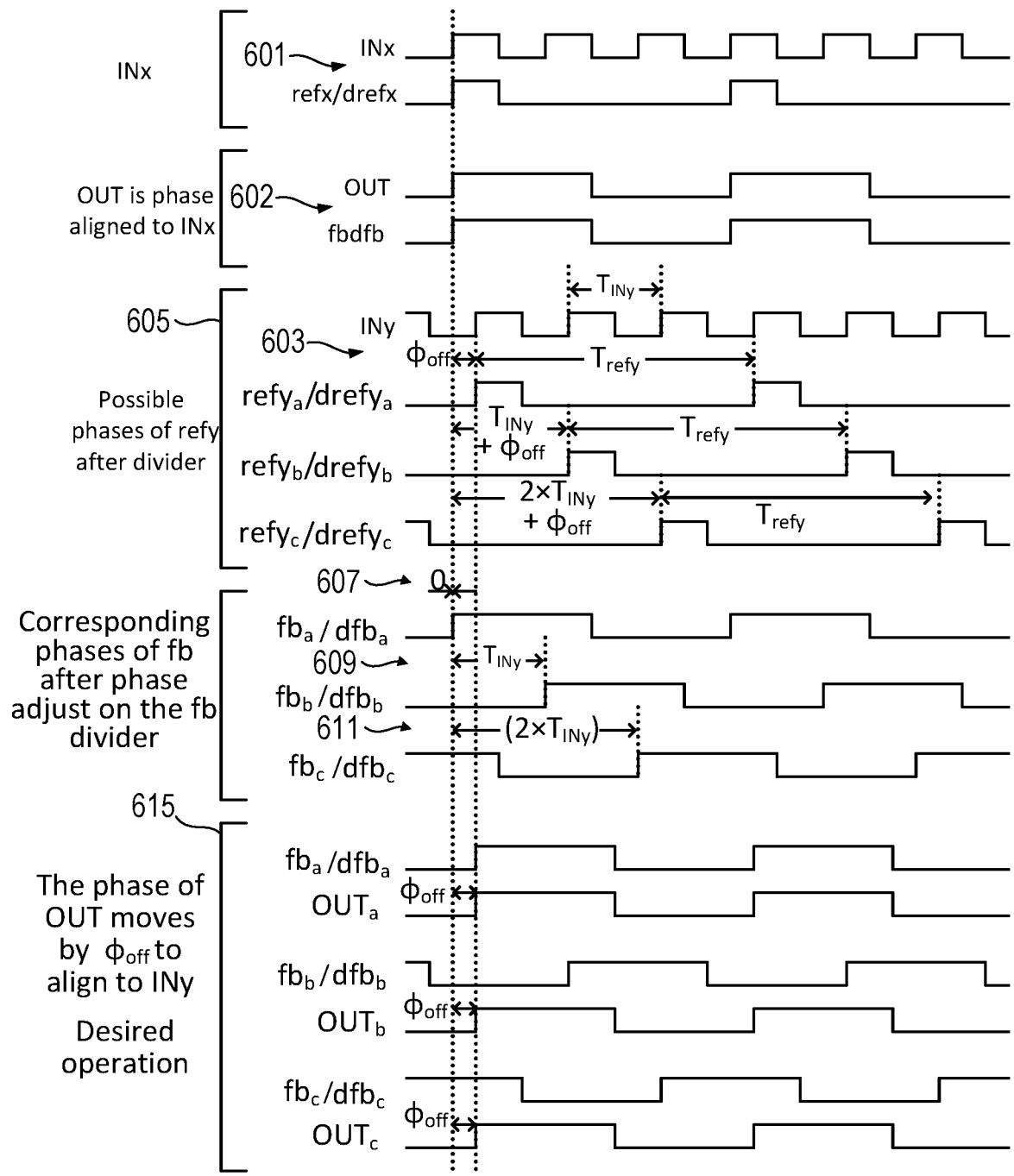
FIG. 6 is a timing diagram illustrating the operation of the embodiment shown in FIG. 5.

FIG. 6 illustrates the operation of the embodiment of FIG. 5 when the divisors of dividers 502 and 504 have the value three. At 601 INx is divided by three to generate refx/drefx. OUT is locked to refx/drefx as shown at 602. INy is phase offset from INx by $\Phi$off as shown at 603. When switching from INx to INy to be the basis for the reference clock signal dref, the phase offset between dref (currently equal to drefx) and dfb has two components: $\Phi$off, and an integral multiple of INy clock periods. In the waveforms shown in FIG. 6, the phase offset between drefx and drefy can be either $\Phi$off for refya/drefya, ($T_{INy}+\Phi$off) for refyb/drefyb, or ($2\times T_{INy}+\Phi$off) for refyc/drefyc as shown in the section 605 showing the possible phases of refy after divider 504. In the embodiment illustrated in FIG. 6, divider 530 divides the oscillator output signal 529 by (1×fb-divide-ratio) to generate OUT 534, where the fb-divide-ratio is the divide ratio of feedback divider 531.

The embodiment illustrated in FIGS. 5 and 6 removes the N $T_{INy}$ component of the phase offset by adjusting the phase of fb by 'adj' 535, which corresponds to the appropriate integral number of INy clock periods. As shown in FIG. 6, fba/dfba is adjusted by 0 $T_{INy}$ periods (N=0) at 607. The feedback signals fbb/dfbb is adjusted by 1 $T_{INy}$ periods (N=1) at 609. The feedback signal fbc/dfbc is adjusted by 2 $T_{INy}$ periods (N=2) at 611. That means that the feedback clock signal fb/dfb is now $\Phi$off from the newly selected reference signal refy/drefy regardless of whether refy is refya, refyb, or refyc. Referring to section 609, that results in OUT moving by $\Phi$off no matter where refy/drefy starts in terms of the three possible clock periods of INy. As shown in section 615, once the phase of fb/dfb has been adjusted, the new offset between dref and dfb is always $\Phi$off, and the PLL will move the phase of OUT by $\Phi$off to lock the loop to the new reference clock signal refy regardless of the state of the divider 504.

When using TDC's to represent signal edges digitally, the following values can all be calculated digitally. $T_{INy}$:=Trefy/ Input divider divisor (divy). The phase offset between dref and dfb: =dref−dfb. The phase adjust on fb: =round((dref− dfb)/$T_{INy}$). For the case where divisors are three, the phase adjust will be 0, 1, or 2. The possible values of phase adjust will vary based on the divisor. Referring again to FIG. 5, the adjustment calculator 539 receives the relevant signals drefx, drefy, divx, and divy and calculates the phase adjust 535. $T_{INy}$ can be calculated from successive active edges of drefy. The feedback control logic 537 adjusts the divider 531 to cause the phase of fb to move the appropriate integral number of $T_{INy}$ cycles. Note that the adjust is applied only one time after which the feedback divider is aligned within the offset Φoff to the divided down reference clock signal.

Note that while the description has described changing from using INx to using INy as the basis for the reference clock signal dref, the same approach is used to change from INy to using INx. Note also that although the embodiment in FIGS. 5 and 6 assume digital values are utilized in PFD 521, in other embodiments, the adjust can be used with an analog PFD and charge pumps to represent the phase difference that is supplied to the loop filter. In addition, while the embodiment of FIG. 5 shows a DCO other embodiments utilize other oscillators, e.g., a conventional voltage controlled oscillator. While the adjustment calculator 539 is shown as a block, the implementation of the adjustment calculator may be in digital logic, a programmed microcontroller, or any appropriate combination of logic and programmed logic to generate the proper adjust value 535.

Figure 7:
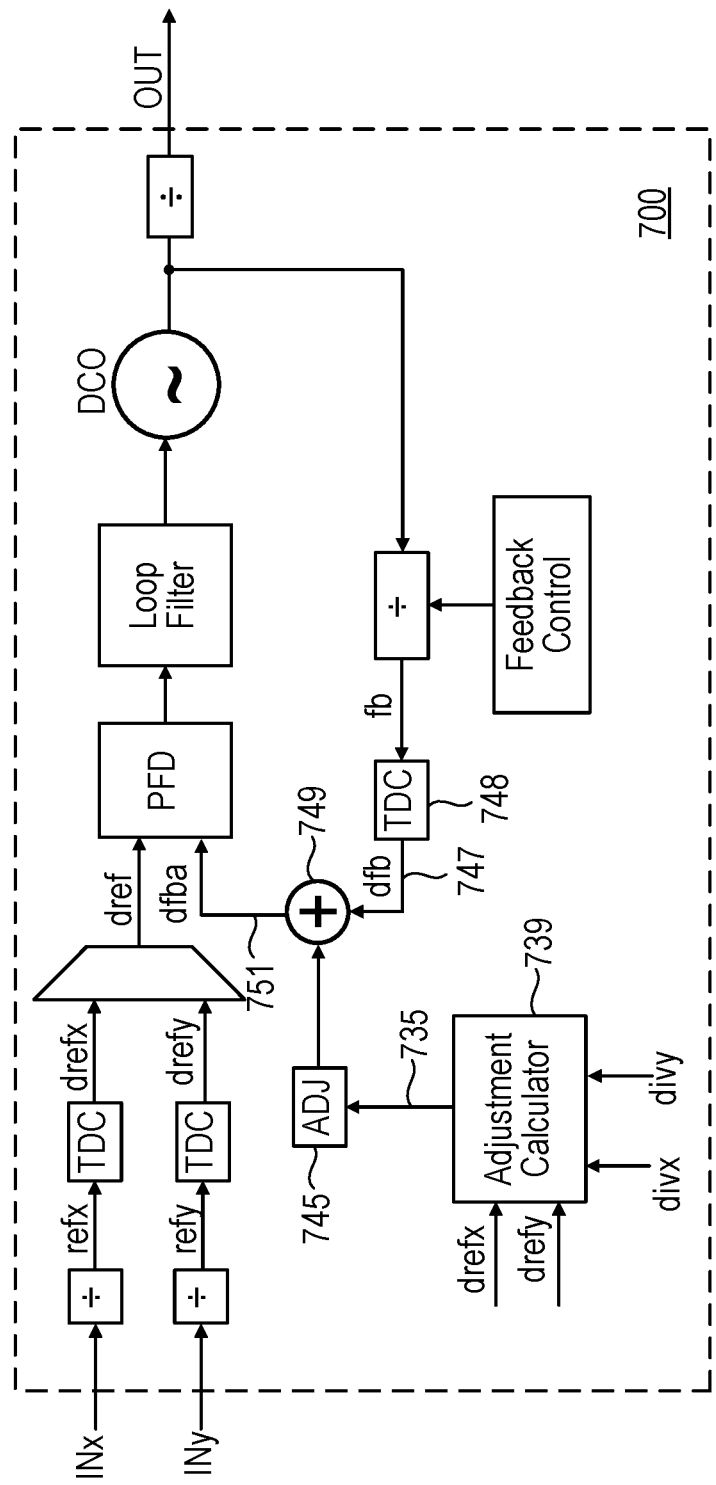
FIG. 7 illustrates an embodiment in which a phase adjustment corresponding to an integral number of reference clock periods is made to a digital feedback signal.
Figure 8:
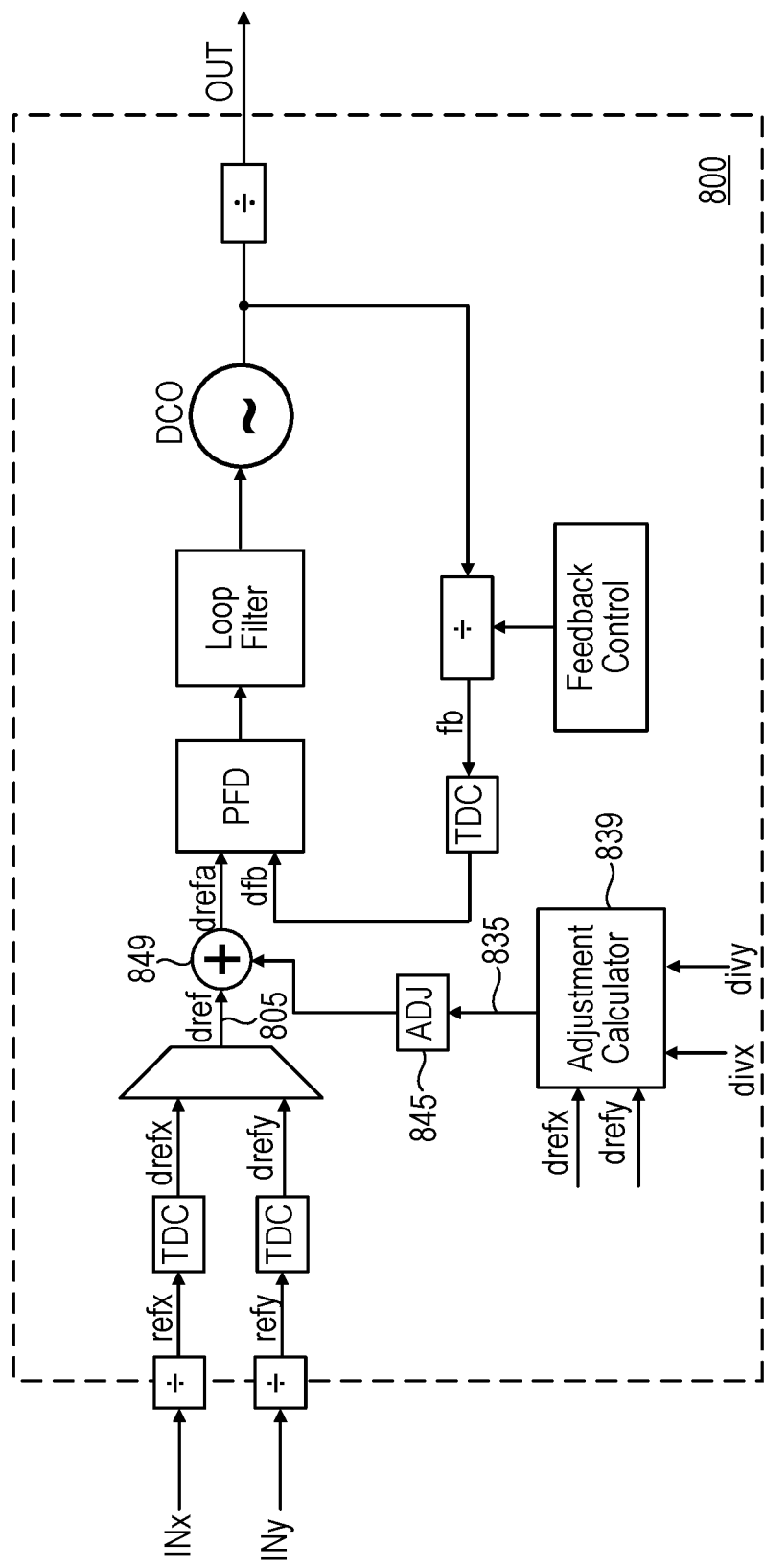
FIG. 8 illustrates an embodiment in which a phase adjustment corresponding to an integral number of reference clock periods is made to the digital reference clock signal.

For a digital PLL using digital values to indicate clock edges, the phase adjust on the feedback fb can be implemented as an offset in the loop (added digitally to dfb or dref) instead of an adjustment to the feedback divider. Thus, referring to FIG. 7, the adjustment calculator 739 calculates and stores the adjustment value 735 in storage 745. That adjustment value is added to the digital feedback value dfb 747 from TDC 748 in summer 749 to generate an adjusted feedback signal dfba 751. Assuming the reference clock switch was from using refx to using refy, the phase adjust needs to be added to the dfb 747 as long as refy is being used as the basis for dref after switching from refx. That is because the feedback signal dfb (referring back to FIG. 6) still appears as if it is fba/dfba. That is, there is no correction in the fb signal until the correction is made digitally in summer 749. Note that when implementing the phase adjust by adding the integral number of reference clock periods digitally to dfb or dref, since the clock period of the reference clock being used may wander slightly in normal operation, e.g., the period of INy may wander, the digital phase adjust should be adjusted to match any wandering of the clock period after switching to using the new reference clock.

In another embodiment, in PLL 800 the offset is adjusted in the loop by adding in the adjustment 835 generated by adjustment calculator 839 and stored in memory 845 to dref 805 in summer 849. Assuming the switch from using INx to using INy as shown in FIG. 6, the phase adjust value 835 needs to be added to dref as long as refy is being used as the basis for dref. That is because the feedback signal dfb (referring back to FIG. 6) still appears as if it is fba/dfba. That is, there is no correction in the fb signal until the correction is made digitally in summer 849.

Thus, various aspects have been described related to accounting for input dividers for reference clocks in PLLs. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
receiving a first reference clock signal;
receiving a second reference clock signal;
dividing the first reference clock signal in a first divider and supplying a divided first reference clock signal;
dividing the second reference clock signal in a second divider and supplying a divided second reference clock signal;
switching from using the divided first reference clock signal as basis for a reference clock signal in a phase-locked loop to using the divided second reference clock signal as the basis for the reference clock signal in the phase-locked loop; and
responsive to a phase difference between the divided first reference clock signal and the divided second reference clock signal including one or more clock periods of the second reference clock signal, as part of switching to using the divided second reference clock signal as the basis for the reference clock signal, performing a phase adjust to remove the one or more clock periods of the second reference clock signal from the phase difference.

2. The method as recited in claim 1 further comprising:
converting an edge of the divided first reference clock signal to a first digital value; and
converting an edge of the divided second reference clock signal to a second digital value;
determining a difference between the first digital value and the second digital value; and
dividing the difference by a digital representation of a period of the second reference clock signal and rounding a result of the dividing to determine the phase adjust.

3. The method as recited in claim 1 further comprising determining the phase adjust based on a difference between the divided first reference clock signal and the divided second reference clock signal and dividing the difference by a period of the second reference clock signal to determine an amount of the phase adjust.

4. The method as recited in claim 1 further comprising:
performing the phase adjust in a feedback divider of the phase-locked loop to adjust a phase of a feedback divider signal by the one or more clock periods of the second reference clock signal corresponding to the phase adjust.

5. The method as recited in claim 4 further comprising:
performing the phase adjust only once in the feedback divider responsive to switching to using the divided second reference clock signal as the basis for the reference clock signal.

6. The method as recited in claim 1 further comprising:
storing a digital value corresponding to the phase adjust; and
adjusting successive digital values corresponding respectively to successive edges of the divided second reference clock signal by the digital value.

7. The method as recited in claim 1 further comprising:
storing a digital value corresponding to the phase adjust; and
adjusting successive digital values corresponding respectively to successive edges of a feedback divider signal by the digital value.

8. An apparatus comprising:
a first divider coupled to receive a first reference clock signal and supply a first divided reference clock signal;
a second divider coupled to receive a second reference clock signal and supply a second divided reference clock signal;
wherein the apparatus is responsive to a phase difference between the first divided reference clock signal and the second divided reference clock signal including one or more clock periods of the second reference clock signal, to perform a phase adjust to remove the one or more clock periods of the second reference clock signal present in the phase difference.

9. The apparatus as recited in claim 8 further comprising:
a first time to digital converter to convert edges of the divided first reference clock signal to respective first digital values indicative of time of occurrence of the edges of the divided first reference clock signal; and
a second time to digital converter to convert edges of the divided second reference clock signal to respective second digital values indicative of time of occurrence of the edges of the divided second reference clock signal.

10. The apparatus as recited in claim 9 further comprising:
selection logic to select as a reference clock signal the respective first digital values indicative of time of occurrence of the edges of the divided first reference clock signal or the respective second digital values indicative of time of occurrence of the edges of the divided second reference clock signal.

11. The apparatus as recited in claim 8 wherein the phase adjust is determined according to a difference between the first divided reference clock signal and the second divided reference clock signal and the difference divided by a period of the second reference clock signal.

12. The apparatus as recited in claim 8 further comprising:
an oscillator to supply an oscillator output signal;
a feedback divider coupled to the oscillator output signal and configured to divide the oscillator output signal and supply a feedback divider signal; and
wherein the phase adjust is performed in the feedback divider to adjust a phase of the feedback divider signal by an integral number of periods of the second reference clock signal corresponding to the phase adjust, the integral number of periods.

13. The apparatus as recited in claim 8 further comprising:
storage to store a digital phase adjust; and
an arithmetic circuit to add the digital phase adjust to successive digital values corresponding respectively to successive edges of the divided second reference clock signal.

14. The apparatus as recited in claim 8 further comprising:
an oscillator to supply an oscillator output signal;
a feedback divider coupled to the oscillator output signal and configured to divide the oscillator output signal and supply a feedback divider signal;
a time-to-digital converter to convert successive edges of the feedback divider signal to respective digital feedback divider digital signals;
storage to store a digital phase adjust; and
an arithmetic circuit to add the digital phase adjust to the respective digital feedback divider digital signals.

15. The apparatus as recited in claim 8 further comprising:
an oscillator to supply an oscillator output signal;
a feedback divider coupled to the oscillator output signal and configured to divide the oscillator output signal and supply a feedback divider signal;
a time-to-digital converter to convert successive edges of the feedback divider signal to respective digital feedback divider digital signals; and
a phase and frequency detector coupled to determine a phase difference between a reference clock signal based on the first divided reference clock signal or the second divided reference clock signal and the feedback divider signal.

16. A phase-locked loop (PLL) comprising:
a first divider coupled to receive a first reference clock signal and supply a first divided reference clock signal;
a second divider coupled to receive a second reference clock signal and supply a second divided reference clock signal;
a phase adjust calculation circuit to determine an integral number of clock periods of the second reference clock signal present in a first phase difference between the first divided reference clock signal and the second divided reference clock signal;
a phase and frequency detector (PFD) coupled to receive a feedback signal and a reference clock signal and to determine a second phase difference between the feedback signal and the reference clock signal; and
wherein the PLL performs a phase adjustment equal to the integral number of clock periods present in the first phase difference to thereby cause the phase and frequency detector, on switching from using the first divided reference clock signal as a basis for the reference clock signal to using the second reference clock signal as the basis for the reference clock signal, to see as a value of the second phase difference a phase difference between the first reference clock signal and the second reference clock signal with one or more periods of the second reference clock signal present in the first phase difference.

17. The phase-locked loop as recited in claim 16 further comprising:
a first time-to-digital converter to convert an edge of the divided first reference clock signal to a first digital value;
a second time-to-digital converter to convert an edge of the divided second reference clock signal to a second digital value;
wherein the phase adjust calculation circuit is configured to determine a difference between the first digital value and the second digital value, divide the difference by a digital representation of a period of the second reference clock signal, and round a result of the divide, to thereby determine the phase adjustment.

18. The phase-locked loop as recited in claim 16 further comprising:
an oscillator supplying an oscillator output signal; and
a feedback divider having a divider input coupled to the oscillator output signal and supplying a divider output signal that is coupled to the PFD and wherein the phase adjustment is performed in the feedback divider to adjust the divider output signal by the one or more periods of the second reference clock signal.

19. The phase-locked loop as recited in claim 16 wherein,
the phase and frequency detector (PFD) is a digital PFD and is coupled to receive a digital feedback signal as the feedback signal and a digital reference clock signal as the reference clock signal;
a summing circuit to add the phase adjustment to the digital feedback signal to implement the phase adjustment.

20. The phase-locked loop as recited in claim 16 wherein,
the phase and frequency detector (PFD) is a digital PFD and is coupled to determine a phase difference between a digital feedback signal as the feedback signal and an adjusted digital reference clock signal as the reference clock signal; and
a summing circuit to add the phase adjustment to a digital representation of the divided second reference clock signal to generate the adjusted digital reference clock signal to implement the phase adjustment.

* * * * *